(12) United States Patent
Kim et al.

(10) Patent No.: US 7,031,686 B2
(45) Date of Patent: Apr. 18, 2006

(54) IMAGE REJECTION MIXER WITH MISMATCH COMPENSATION

(75) Inventors: Youngjin Kim, Kyunggi-do (KR); Kwyro Lee, Daejon (KR)

(73) Assignee: Integrant Technologies, Inc., Seongnam-Si (KR)

( * ) Notice: Subject to any disclaimer, the term of this patent is extended or adjusted under 35 U.S.C. 154(b) by 937 days.

(21) Appl. No.: 09/952,102

(22) Filed: Sep. 13, 2001

(65) Prior Publication Data

US 2002/0160741 A1 Oct. 31, 2002

(30) Foreign Application Priority Data

Mar. 14, 2001 (KR) ............................... 2001-13099

(51) Int. Cl.
*H04B 1/18* (2006.01)

(52) U.S. Cl. ..................... 455/285; 455/326; 327/116
(58) Field of Classification Search ................ 455/128, 455/326, 116
See application file for complete search history.

(56) References Cited

U.S. PATENT DOCUMENTS 6,330,290 B1 * 12/2001 Glas ........................... 375/324
6,731,917 B1 * 5/2004 Krishna ...................... 455/205

OTHER PUBLICATIONS

Pun, K-P, et al., "A Digital Method for the Correction of I/Q Phase Errors in Complex Sub-Sampling Mixers", *IEEE D-7803-5975-5/00*, pp. 171-174 (2000) 2000 Southwest Symposium. Feb. 27-29, 2000.
Glas, .P.F., "Digital I/Q Imbalance Compensation in a Low-IF Receiver", *IEEE O-7803-4984-9-98*, pp. 1461-1466 (1998).
Rudell, JC, et al., "A 1.9-GHz Wide-Band IF Double Conversion CMOS Receiver for Cordles Telephone Applications", *IEEE J Solid State Circuits*, 32(12), pp. 2071-2088, (1997).

* cited by examiner

*Primary Examiner*—Fan Tsang
*Assistant Examiner*—Aung T. Win
(74) *Attorney, Agent, or Firm*—Burns & Levinson LLP; Peter J. Borgherri

(57) ABSTRACT

An image rejection mixer (IRM) for rejecting signals having image frequency and, more particularly, a mixer for rejecting signals of image frequency by using mismatch compensation is provided. The image rejection mixer comprises: first and second mixers; first and second converting means, each of which transforms each output of the first and second mixers to digital signal; third and fourth mixers, each of which mixes output of the first converting means with each of second local oscillation in-phase signal and quadrature-phase signal, respectively; fifth and sixth mixers, each of which mixes output of the second converting means with each of second local oscillation in-phase signal and quadrature-phase signal, respectively; means for subtracting; means for adding; and means for compensating gain-mismatch between the first and second mixers.

7 Claims, 12 Drawing Sheets

IMAGE REJECTION MIXER WITH MISMATCH COMPENSATION

CROSS-REFERENCE TO RELATED APPLICATIONS

This application claims priority under 35 U.S.C. 119(a) of Korean Patent Application Number 10-2001-0013099, entitled "IMAGE REJECTION MIXER WITH MISMATCH COMPENSATION," filed on Mar. 14, 2001, and which is incorporated herein by reference.

BACKGROUND OF THE INVENTION

The present invention relates to an image rejection mixer (IRM) for rejecting signals having image frequency and, more particularly, a mixer for rejecting signals of image frequency by using mismatch compensation.

In the super-heterodyne reception technique, the frequency as far as about two times of the intermediate frequency from the desired reception frequency in the frequency domain, is called the "Image Frequency." Components having the image frequency, which is called the "Image Frequency Components" or the "Image Signal," cause distortion of signals having intermediate frequency. Therefore, it is preferable to reject the image frequency components.

In order to reject image frequency components, band pass filtering method was used. By using a band pass filter to suppress image frequency components among signals received through an antenna, it was possible to prevent distortion of intermediate frequency signals caused by the image frequency components. However, the band pass filtering method costs high, since the cost to make a band pass filter is usually high.

As a method for rejecting image frequency components, image rejection mixer (IRM) architecture was suggested. The IRM architecture may be classified into the Hartley and the Weaver architectures. The Weaver architecture requires at least four mixers. The Weaver architecture, however, may effectively reject image frequency components throughout a band, which is wider than the band through which the Hartley architecture may reject image frequency components.

FIG. 1 shows a schematic view of a block diagram illustrating an IRM of the Weaver architecture. FIG. 2 shows a schematic view of the block diagram of FIG. 1 for illustrating the operation of the IRM of FIG. 1.

As shown in FIG. 1, an input radio frequency signal (RFIN) is mixed with the first local oscillation signal (LO1), $\cos(\omega_{LO1}t)$, at mixer M1. The frequency of the first local oscillation signal (LO1) is called the first local oscillation frequency ($\omega_{LO1}$). The input radio frequency signal (RFIN) is also mixed with the signal, $\sin(\omega_{LO1}t)$, which is resulted by shifting the first local oscillation signal (LO1) by $-90°$, at mixer M2. The outputs of mixers M1 and M2 are in-phase (I) and quadrature-phase (Q) signals, respectively. Frequency of the in-phase and quadrature-phase signals corresponds to the difference between frequency of the input signal and the first local oscillation frequency ($\omega_{LO1}$). The difference between the frequency of the input signal and the first local oscillation frequency ($\omega_{LO1}$) is called the first intermediate frequency ($\omega_{IF1}$).

The outputs of mixers M1 and M2 are provided to mixers M3 and M4, and mixers M5 and M6, respectively.

The in-phase signal (I) output from mixer M1 is mixed with the second local oscillation signal (LO2), $\cos((\omega_{LO2}t)$, at mixer M3. The frequency of the second local oscillation signal (LO2) is called the second local oscillation frequency ($\omega_{LO2}$). The in-phase signal (I) output from mixer M1 is also mixed with the signal, $\sin(\omega_{LO2}t)$, which is resulted by shifting the second local oscillation signal (LO2) by $-90°$, at mixer M4. The outputs of mixers M3 and M4 are in-phase (II) and quadrature-phase (IQ) signals, respectively. Frequency of the in-phase and quadrature-phase signals (II and IQ) corresponds to the difference between the first intermediate frequency ($\omega_{IF1}$) and the second local oscillation frequency ($\omega_{LO2}$) The difference between the first intermediate frequency ($\omega_{IF1}$) and the second local oscillation frequency ($\omega_{LO2}$) is called the second intermediate frequency ($\omega_{LO2}$).

The quadrature-phase signal (Q) output from mixer M2 is mixed with the second local oscillation signal (LO2), $\cos(\omega_{LO2}t)$, at mixer M5. The quadrature-phase signal (Q) output from mixer M2 is also mixed with the signal, $\sin(\omega_{LO2}t)$, which is resulted by shifting the second local oscillation signal (LO2) by $-90°$, at mixer M6. The outputs of mixers M5 and M6 are in-phase (QI) and quadrature-phase (QQ) signals, respectively. Frequency of the in-phase and quadrature-phase signals (QI and QQ) equals the second intermediate frequency ($\omega_{IF2}$)

A subtraction means subtracts the output (QQ) of mixer M6 from the output (II) of mixer M3, to produce an I-path signal. An addition means adds the outputs (IQ and QI) of mixers M4 and M5, to produce a Q-path signal.

Referring to FIG. 2, the operation of the circuit of FIG. 1 when an image signal, $\cos(\omega_{image}t)$, is input. The frequency of the image signal is called the image frequency ($\omega_{image}$).

The image signal, $\cos(\omega_{image}t)$, is mixed with the first local oscillation signal (LO1), $\cos(\omega_{LO1}t)$, at mixer M1. The image signal, $\cos(\omega_{image}t)$ is also mixed with the signal, $\sin(\omega_{LO1}t)$, which is resulted by shifting the first local oscillation signal (LO1) by $-90°$, at mixer M2. Mixer M1 produces a signal, $\cos(\omega_{d1}t)$, having frequency ($\omega_{d1}$) which corresponds to the difference between the image frequency ($\omega_{image}t$) and the first local oscillation frequency ($\omega_{LO1}$). Mixer M2 produces a signal, $\sin(\omega_{d1}t)$, which lags $90°$ behind the output of mixer M1.

The outputs of mixers M1 and M2 are provided to mixers M3 and M4, and mixers M5 and M6, respectively.

At mixer M3, the output from mixer M1, $\cos(\omega_{d1}t)$, is mixed with the second local oscillation signal (LO2), $\cos(\omega_{LO2}t)$. Mixer M3 produces a signal, $\cos(\omega_{d2}t)$, having frequency ($\omega_{d2}$) which corresponds to the difference between the frequency ($\omega_{d1}$) of the output of mixer M1 and the second local oscillation frequency ($\omega_{L2}$)

At mixer M4, the output from mixer M1, $\cos(\omega_{d1}t)$, is also mixed with the signal, $\sin((\omega_{LO2}t)$, which is resulted by shifting the second local oscillation signal (LO2) by $-90°$. Mixer M4 produces a signal, $\sin(\omega_{d2}t)$, having frequency which equals that of the output of mixer M3. The output of mixer M4 lags $90°$ behind the output of mixer M3.

At mixer M5, the output from mixer M2, $\sin(\omega_{d1}t)$, is mixed with the second local oscillation signal (LO2), $\cos(\omega_{LO2}t)$. Mixer M5 produces a signal, $\sin(\omega_{d2}t)$, having frequency ($\omega_{d2}$) which equals those of the outputs of mixers M3 and M4. The output of mixer M5 lags $90°$ behind the output of mixer M3.

At mixer M6, the output from mixer M2 is also mixed with the signal, $\sin((\omega_{LO2}t)$, which is resulted by shifting the second local oscillation signal (LO2) by $-90°$. Mixer M6 produces a signal, $\cos(\omega_{d2}t)$, having frequency which equals those of the outputs of mixers M3, M4, and M5. Phase of the output signal of mixer M6 equals that of the output signal of mixer M3.

As shown above, the output of mixer M3 is identical to that of mixer M6. Therefore, the outputs of mixers M3 and M6 can be canceled out each other, by subtracting one from the other using a subtraction mean (A1). Further, the output of mixer M4 has phase that is 180° different from that of the output of mixer M5. Therefore, the outputs of mixers M4 and M5 can also be canceled out each other, by adding together using an addition mean (A2).

The outputs of mixers M1 through M6 further contain a plurality of frequency components, which are resulted by multiplication of input signal and the local oscillation signals. Those frequency components may be filtered out by using low pass filters.

In order to cancel out the image signal from the output of the mixer circuit as completely as possible, it is preferable that each gain of mixers M1 through M6 be equal. It is also preferable that the local oscillation signals provided to mixers M1 and M2 have equal frequency. Further, it is preferable that the local oscillation signals provided to mixers M3 through M6 have equal frequency.

In the Weaver architecture, one of the dominant reasons for the incomplete cancellation of the image frequency components is that gain is not equal between mixers M1 and M2, and among mixers M3, M4, M5, and M6. In the specification, the difference of gain between mixers M1 and M2 and among mixers M3, M4, M5, and M6 is called the gain mismatch. Other reason is that the phase difference between local oscillation signals provided to mixers M1 and M2, M3 and M4, and M5 and M6 is not correctly 90°. The deviation of the phase difference from 90° is called the phase mismatch.

It is known in the art that, in order to cancel image frequency components of 30 to 40 dB, the gain and phase mismatch should be within 0.2 to 0.4 dB and 0° to 2°. It is also known in the art that it is not easy to meet these requirements merely by making or changing design for a circuit and modifying layout of a circuit.

BRIEF SUMMARY OF THE INVENTION

In order to solve the above problem, an object of the present invention is to provide a mixer that can reject image frequency components.

Another object of the present invention is to provide a mixer which can reject image frequency components by compensating the gain mismatch occurred in the mixers and phase mismatch occurred in the local oscillation signals.

According to an aspect of the present invention, an image rejection mixer is provided, which comprises: first mixer having first gain and second mixer having second gain, each of which mixes an input signal with each of first local oscillation in-phase signal and first local oscillation quadrature-phase signal, respectively, wherein the first local oscillation quadrature-phase signal is resulted by shifting the first local oscillation in-phase signal by −90°; first and second analogue to digital converting means, each of which transforms each output of the first and second mixers to digital signal; third mixer having third gain and fourth mixer having fourth gain, each of which mixes output of the first analogue to digital converting means with each of second local oscillation in-phase signal and second local oscillation quadrature-phase signal, respectively, wherein the second local oscillation quadrature-phase signal is resulted by shifting the second local oscillation in-phase signal by −90°; fifth mixer having fifth gain and sixth mixer having sixth gain, each of which mixes output of the second analogue to digital converting means with each of second local oscillation in-phase signal and second local oscillation quadrature-phase signal, respectively; means for subtracting output of the sixth mixer from output of the third mixer; means for adding outputs of the fourth and fifth mixers; and means for compensating gain-mismatch between the first and second mixers by controlling output of the means for subtracting and means for adding.

According to other aspect of the present invention, an image rejection mixer is provided, which comprises: first and second mixers, each of which mixes an input signal with each of first local oscillation in-phase signal and first local oscillation quadrature-phase signal, respectively, wherein the first local oscillation quadrature-phase signal is resulted by shifting the first local oscillation in-phase signal by −90°; first and second analogue to digital converting means, each of which transforms each output of the first and second mixers to digital signal; third and fourth mixers, each of which mixes output of the first analogue to digital converting means with each of second local oscillation in-phase signal and second local oscillation quadrature-phase signal, respectively, wherein the second local oscillation quadrature-phase signal is resulted by shifting the second local oscillation in-phase signal by −90°; fifth and sixth mixers, each of which mixes output of the second analogue to digital converting means with each of second local oscillation in-phase signal and second local oscillation quadrature-phase signal, respectively; means for subtracting output of the sixth mixer from output of the third mixer; means for adding outputs of the fourth and fifth mixers; and means for reducing difference between 90° and phase difference between the first local oscillation in-phase and quadrature-phase signals by controlling the output of the means for subtracting and the means for adding.

DETAILED DESCRIPTION OF THE INVENTION

Hereinafter, preferred embodiments of the present invention will be described in detail with reference to the attached drawings.

Figure 1:
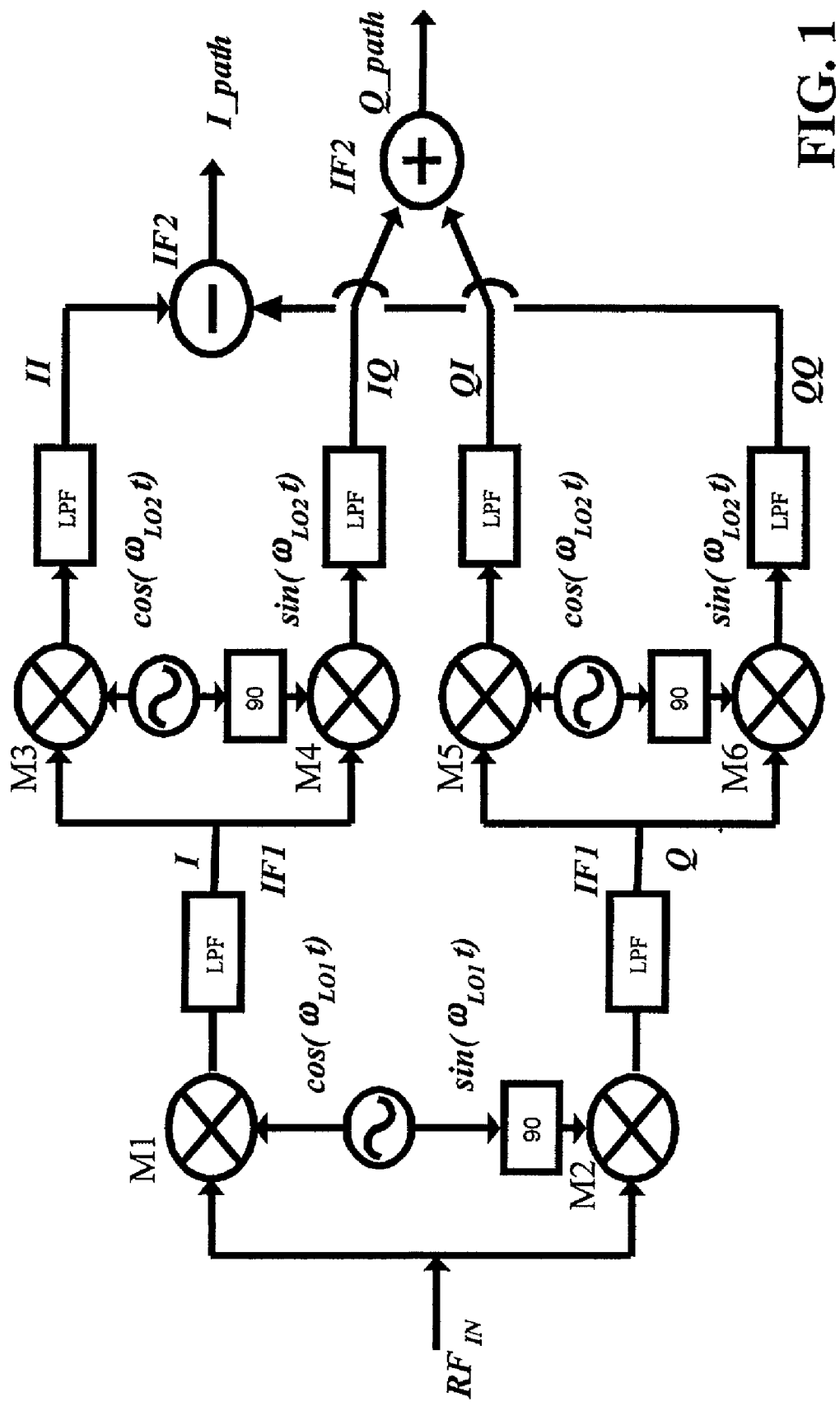
FIG. 1 shows a schematic view of a block diagram illustrating an IRM of the Weaver architecture.
Figure 2:
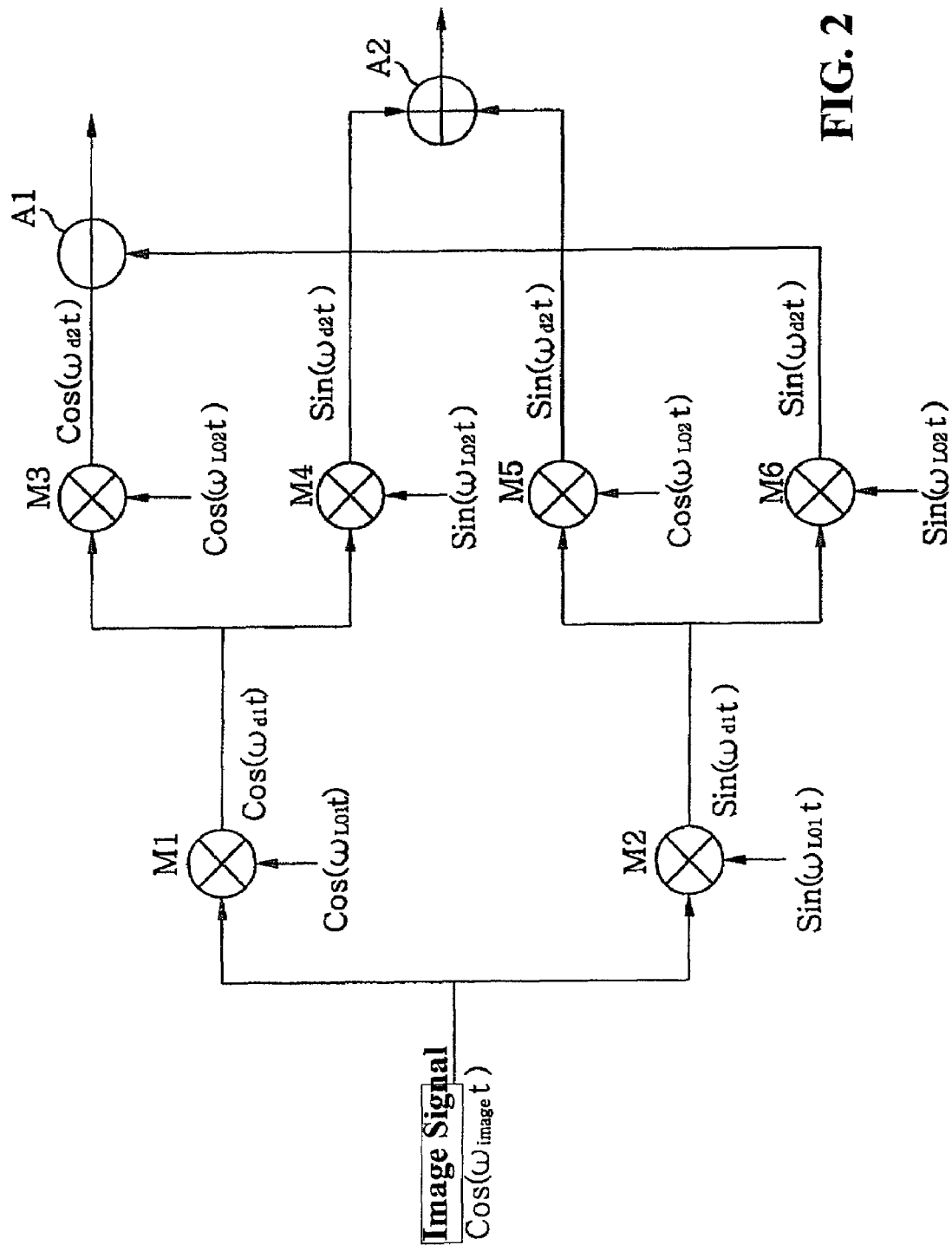
FIG. 2 shows a schematic view of the block diagram of FIG. 1 for illustrating the operation of the IRM of FIG. 1.
Figure 3:
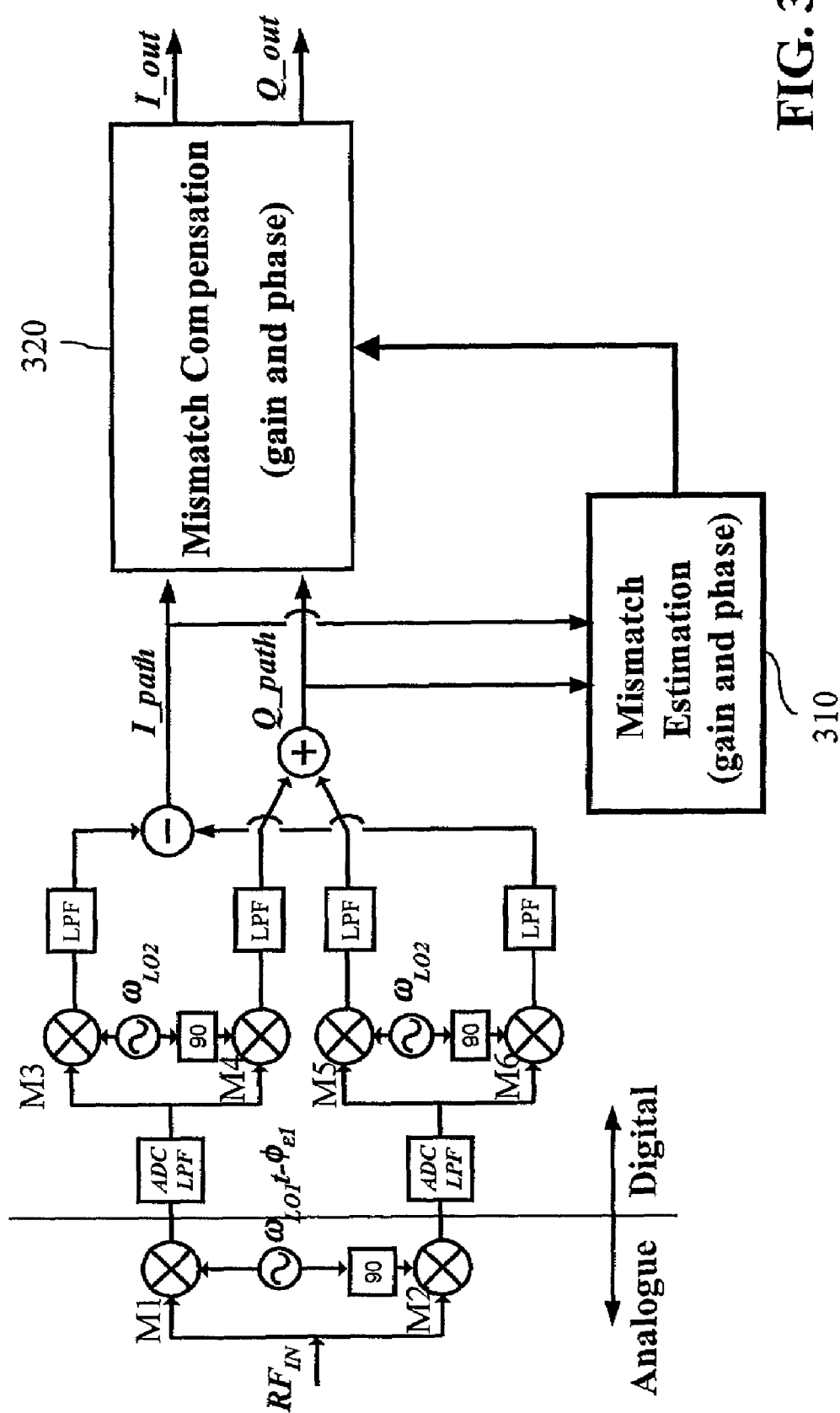
FIG. 3 shows a schematic view of a circuit diagram for illustrating a mixer according to the present invention.

FIG. 3 shows a schematic view of a circuit diagram for illustrating a mixer according to the present invention.

As shown in FIG. 3, the mixer according to the present invention comprises an analogue circuit part and a digital circuit part.

The analogue circuit part includes mixers M1 and M2 to which input signal (RFIN) received by an antenna is input. Each output of mixers M1 and M2 is transformed into a digital signal by each of digital conversion means, e.g., analogue to digital converters (ADC), respectively.

The digital circuit part includes mixers M3 and M4 to which output of the first ADC is driven and mixers M5 and M6 to which output of the second ADC is driven. I-path signal is generated by subtracting output of mixer M3 from output of mixer M6. Q-path signal is generated by adding outputs of mixers M4 and M5. The digital circuit part further comprises a mismatch estimation block (310) for estimating mismatch of gain and phase between the I-path and Q-path signals. The digital circuit part further comprises a mismatch compensation block (320) for compensating the mismatch based on the estimation value output from the mismatch estimation block (310).

At mixer M1, input radio frequency signal (RFIN) is mixed with the first local oscillation signal, $\cos(\omega_{LO1}t)$. At mixer M2, the input radio frequency signal RFIN is also mixed with the signal, $\sin(\omega_{LO1}t)$, which is resulted by shifting the first local oscillation signal by −90°. In the specification, the first local oscillation signal is called the first local oscillation in-phase signal. The signal which is resulted by shifting the first local oscillation signal by −90° is called the first local oscillation quadrature-phase signal.

In this manner, mixer M1 outputs an in-phase signal (I) having the first intermediate frequency (IF1) which corresponds to the difference between the frequency of the input signal and the first local oscillation signal. Mixer M2 outputs a quadrature-phase signal (Q) having the first intermediate frequency (IF1).

Each output of mixers M1 and M2 is converted to digital signal through each of the first and second ADCs, respectively. The first and second ADCs may be implemented by employing sampling circuitry and low pass filtering circuitry. Any circuit known in the art can also be employed.

Each output of the first and second ADCs is provided to each mixer pair of mixers M3 and M4, and mixers M5 and M6, respectively.

At mixer M3, the signal (I) output from the first ADC is mixed with the second local oscillation signal, $\cos((\omega_{LO2}t)$. Mixer M3 outputs an in-phase signal (II) having the second intermediate frequency (IF2) which corresponds to the difference between frequency of the signal (I) and the second local oscillation signal.

At mixer M4, the signal (I) output from the first ADC is mixed with the signal which is resulted by shifting the second local oscillation signal by −90°. Mixer M4 outputs a quadrature-phase signal (IQ) having the second intermediate frequency (IF2).

At mixer M5, the signal (Q) output from the second ADC is mixed with the second local oscillation signal, $\cos(\omega_{LO2}t)$. Mixer M5 outputs an in-phase signal (QI) having the second intermediate frequency (IF2) which corresponds to the difference between frequency of the signal (I) and the second local oscillation signal.

At mixer M6, the signal (Q) output from the second ADC is mixed with the signal which is resulted by shifting the second local oscillation signal by −90°. Mixer M6 outputs a quadrature-phase signal (QQ) having the second intermediate frequency (IF2).

In the specification, the second local oscillation signal is called the second local oscillation in-phase signal. The signal which is resulted by shifting the second local oscillation signal by −90° is called the second local oscillation quadrature-phase signal.

A subtraction mean subtracts the output (QQ) of mixer M6 from the output (II) of mixer M3, to produce I-path signal. An addition means adds the outputs (IQ and QI) of mixers M4 and M5, to produce Q-path signal.

The mismatch estimation block (310) estimates mismatch of gain and phase between the I-path and Q-path signals. The mismatch in gain and phase is resulted primarily from the mismatch in the mixers in the analogue circuit part.

The mismatch compensation block (320) compensates the mismatch in the I-path and Q-path signals in accordance with the estimation value output from the mismatch estimation block (310). Preferably, the estimation compensation block (320) operates in digital domain.

According to an embodiment of the present invention, the mismatch compensation block (320) comprises a means for compensating gain-mismatch of mixers M1 and M2 by using the I-path and Q-path signals. Preferably, the compensation of gain-mismatch is achieved by controlling the output of the subtraction means and addition means.

The mismatch compensation block (320) further comprises a means for reducing difference between 90° and phase-difference between the first local oscillation in-phase and quadrature-phase signals. Preferably, the compensation of phase-mismatch is achieved by controlling the output of the subtraction means and addition means.

According to the present invention, gain mismatch of mixers and phase mismatch of local oscillation signals is compensated. Compensation of gain mismatch and phase mismatch contributes in cancellation of image frequency components, as described below.

Figure 4:
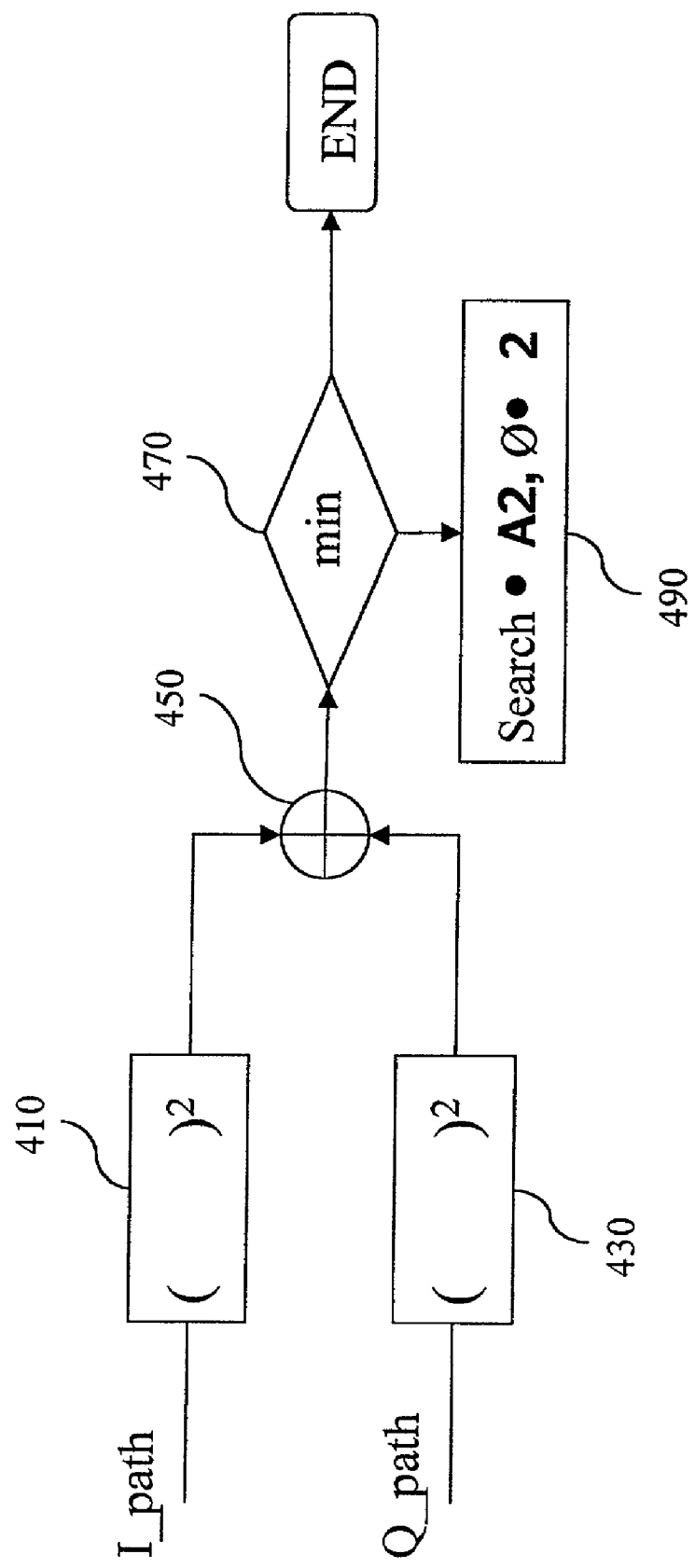
FIG. 4 shows a block diagram illustrating an embodiment of mismatch estimation block (310) according to the present invention.

FIG. 4 shows a block diagram illustrating an embodiment of mismatch estimation block (310) according to the present invention.

As shown in FIG. 4, an embodiment of mismatch estimation block (310) comprises I-path squaring block (410) for squaring the I-path signal level, Q-path squaring block (430) for squaring the Q-path signal level, an addition means (450) for adding outputs of the I-path and Q-path squaring means (410 and 430), an estimation means (490) for estimating gain and phase compensation values ($\Delta A2$ and $\varnothing_{e2}$) by which output of the addition means (450) is minimized. According to the embodiment of FIG. 4, mismatch compensation values are estimated by selecting values which minimizes summation of square of the I-path and Q-path signal levels. The compensation values may also be determined by using any methods other than this. According to the spirit of the invention, the embodiment of FIG. 4 may be changed and any method for determining the compensation values may be employed, as set forth below.

Figure 5A:
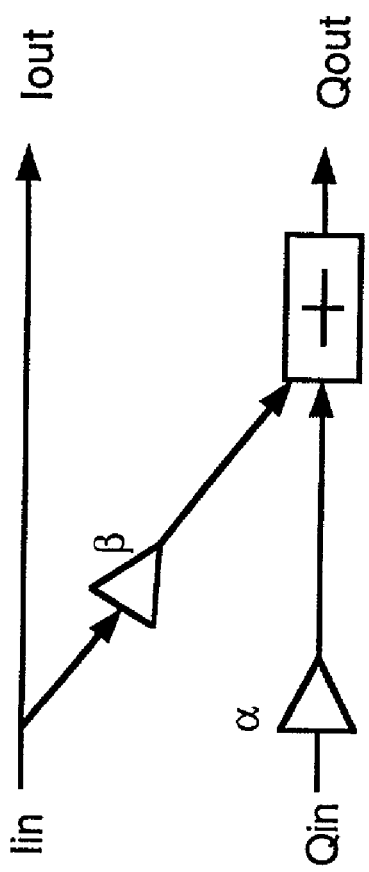
FIG. 5a illustrates an embodiment of the mismatch compensation block (320) being applicable for a signal having single frequency.
Figure 5B:
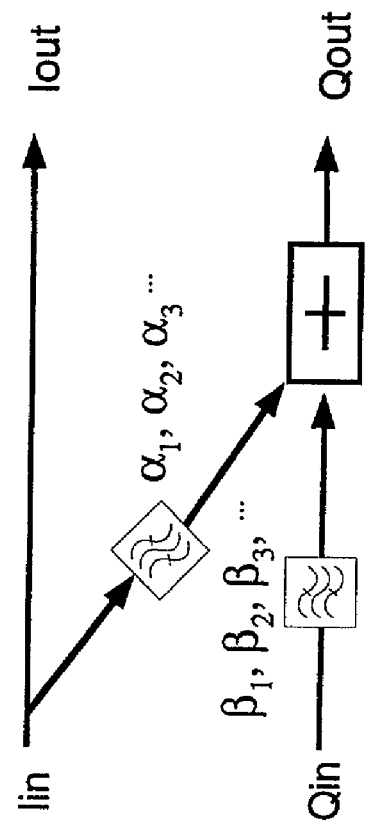
FIG. 5b illustrates an embodiment of the mismatch compensation block (320) being applicable for signals of various frequencies within a band.

FIG. 5 shows circuit diagrams illustrating embodiments of the mismatch compensation block (320) according to the present invention. FIG. 5a illustrates an embodiment of the mismatch compensation block (320) being applicable for a signal having single frequency. FIG. 5b illustrates an embodiment of the mismatch compensation block (320) being applicable for signals of various frequencies within a band.

According to FIG. 5a, the embodiment of the mismatch compensation block (320) is preferably 4-port block having 2 input and 2 output ports. The block receives I-input and Q-input signals through 2 input ports. The block outputs the I-input as it is received, through an output port. The block also outputs summation of the I-input signal multiplied by $\alpha$ and the Q-input signal multiplied by $\beta$.

The operation of the embodiments of FIGS. 5a and 5b will be described for an exemplary case where gain mismatch ($\Delta A$) and phase mismatch ($\emptyset_e$) exists between the I-input and Q-input signals as shown in Eqn. 1.

$$I_{in} = \frac{A}{2}\cos(\omega_{IF2}t + \theta) \qquad \text{Eqn. 1}$$

$$Q_{in} = \frac{-A}{2}(1 - \Delta A)\sin(\omega_{IF2}t + \theta + \phi_s)$$

In this case, $\alpha$ and $\beta$ may be determined in accordance with Eqn. 2.

$$\alpha = \frac{1}{(1 - \Delta A)\cos(\phi_s)} \qquad \text{Eqn. 2}$$

$$\beta = -\tan(\phi_s)$$

If $\alpha$ and $\beta$ is determined pursuant to Eqn. 2, the gain mismatch and phase mismatch can be compensated in accordance with Eqn. 1.

Method for compensating mismatch for filters which are able to reject single image frequency signal has been explained with reference to FIG. 5a. It is also possible to compensate gain and phase mismatch for signals which are included in a band. In this case, it is preferable that N signals having frequencies of f1, f2, . . . and fN within the band are selected, and mismatch compensation values are determined for the selected N signals. Preferably, N gain and phase mismatch compensation values ($\Delta A$ and $\emptyset_e$) are estimated.

Then, gain and phase compensation is performed by using the estimated values. In the exemplary embodiment of FIG. 5b, compensation block (320) is preferably 4-port block having 2 input and 2 output ports. The block receives I-input and Q-input signals through 2 input ports. The block outputs the I-input as it is received, through an output port. The block also outputs summation of the I-input signal multiplied by $\alpha$ and the Q-input signal multiplied by $\beta$. In this case, it is preferable that multiplication by $\alpha$ and $\beta$ is implemented by using filters ($\alpha$ and $\beta$) each having $\alpha 1$, $\alpha 2$, . . . and $\alpha N$ and $\beta 1$, $\beta 2$, . . . and $\beta N$, respectively, as its coefficients with respect to frequencies of f1, f2, . . . and fN. Preferably, the filters ($\alpha$ and $\beta$) may be implemented as digital filters in the digital domain. When gain and phase mismatch values are $\Delta A1$, $\Delta A2$, . . . and $\Delta AN$ and $\emptyset_{e1}$, $\emptyset_{e2}$, . . . and $\emptyset_{eN}$ with respect to frequencies of f1, f2, . . . and fN, the coefficients of the filters may be determined pursuant to Eqn. 3.

$$\alpha_1 = \frac{1}{(1 - \Delta A)\cos(\phi_{s1})}, \quad \alpha_2 = \frac{1}{(1 - \Delta A)\cos(\phi_{s2})}, \qquad \text{Eqn. 3}$$

$$\alpha_3 = \frac{1}{(1 - \Delta A)\cos(\phi_{s3})},$$

$$\beta_1 = -\tan(\phi_{s1}), \quad \beta_2 = -\tan(\phi_2), \quad \beta_3 = -\tan(\phi_3),$$

According to another embodiment of the present invention, mismatch compensation may also be performed along with the temperature variation. In this case, the coefficients of filter may be varied in dependent on the temperature. Preferably, temperature is measured and, then, filter coefficients may be determined or selected in accordance with the measured temperature.

According to further embodiment of the present invention, mismatch compensation may also be performed along with passing of operation time. In this case, the coefficients of filter may be varied in accordance with the time elapsed.

Further, it is also preferable that the coefficients of filter are determined based on the relationship between the measured temperature and time elapsed.

Figure 6:
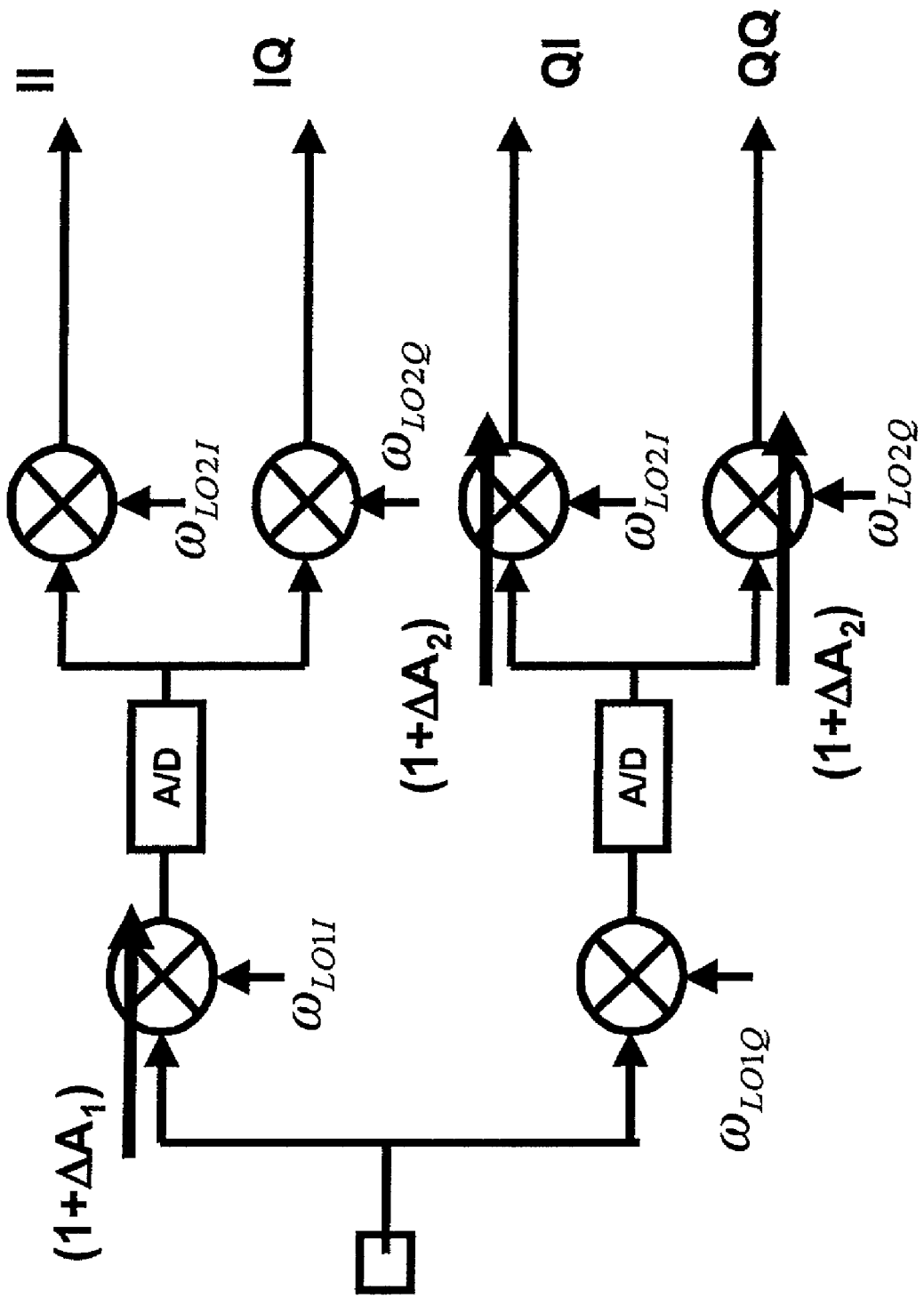
FIG. 6 shows a block diagram for illustrating operation of the embodiment according to the present invention.

FIG. 6 shows a block diagram for illustrating operation of the embodiment according to the present invention. In the embodiment of FIG. 6, gain mismatch ($\Delta A1$) of mixers M1 and M2 is estimated in the analogue domain and, then, gain compensation value ($\Delta A2$) for compensating the estimated mismatch is driven to mixers (M5 and M6) in the digital domain. In this manner, influence of the gain mismatch occurred in the analogue domain may be minimized throughout the outputs II, IQ, QI, and QQ.

According to the embodiment of FIG. 6, in the digital domain, gain of mixers M5 and M6 is adjusted to be different from, e.g., larger than gain of mixers M3 and M4 by a predetermined gain compensation value ($\Delta A1$). Then, the gain compensation value ($\Delta A1$) is varied gradually until influence of the gain mismatch of mixers M1 and M2 on the output is minimized.

Figure 7:
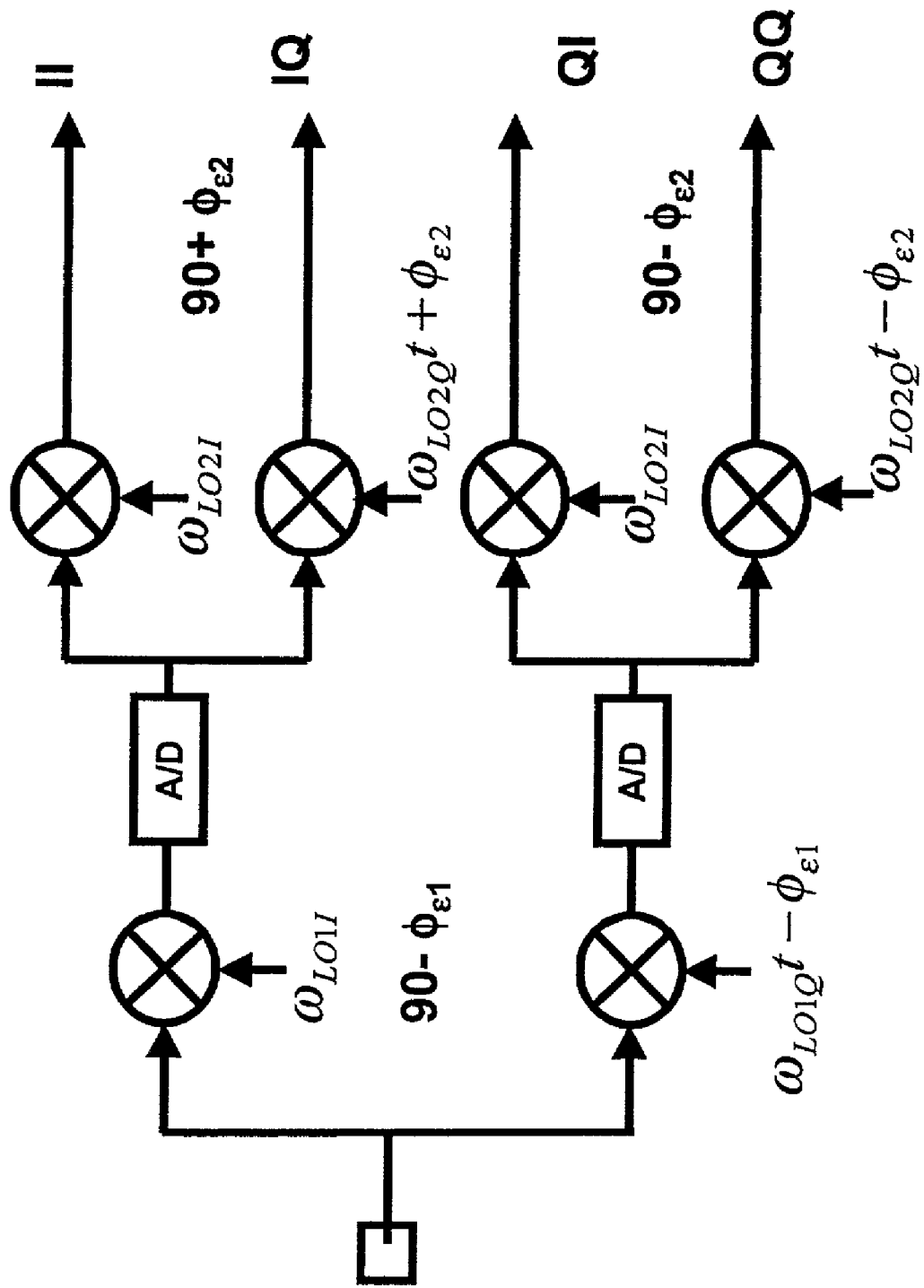
FIG. 7 shows a block diagram for illustrating operation of the embodiment according to the present invention.

FIG. 7 shows a block diagram for illustrating operation of the embodiment according to the present invention. In the embodiment of FIG. 7, phase mismatch ($\emptyset_{e1}$) of the first local oscillation signals (LO1I and LO1Q) is estimated in the analogue domain and, then, phase compensation value ($\emptyset_{e2}$) for compensating the estimated mismatch is driven to the second local oscillation signals (LQ2I and LO2Q) in the digital domain. In this manner, influence of the phase mismatch occurred in the analogue domain may be minimized throughout the outputs II, IQ, QI, and QQ.

According to the embodiment of FIG. 7, in the digital domain, phase difference between the second local oscillation in-phase and quadrature-phase signals (LO2I and LO2Q) is adjusted to be larger or smaller than 90° by a predetermined phase compensation value ($\emptyset_{e2}$) Then, the phase compensation value ($\emptyset_{e2}$) is varied gradually until influence of the phase mismatch of the first local oscillation in-phase and quadrature-phase signals on the output is minimized.

Figure 8:
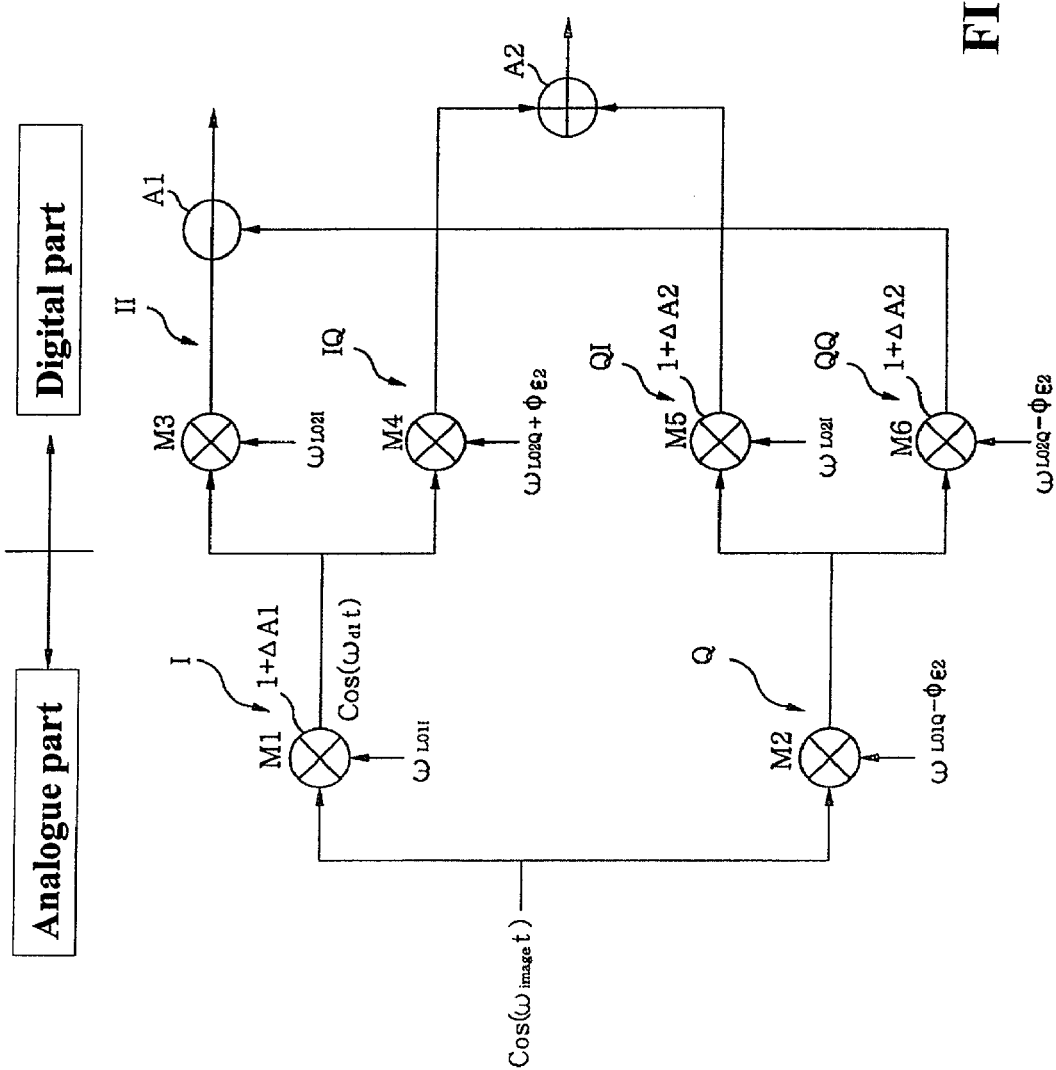
FIG. 8 is a block diagram for illustrating operation of the embodiment according to the present invention when a cosine signal having frequency, which equals to the image frequency, is received through an antenna.

FIG. 8 is a block diagram for illustrating operation of the embodiment according to the present invention when a cosine signal having frequency, which equals to the image frequency, is received through an antenna.

When an image frequency signal, $\cos(\omega_{image}t)$, is provided to the circuit of FIG. 8, the image frequency signal pass through mixers M1 and M2 and I-path and Q-path routes. Then, the image frequency signal pass through ADCs, mixers (M3 through M6), and then II, IQ, QI, and QQ paths. I-path means in-phase path, i.e., a path wherein signal has the same phase as the input cosine signal. Q-path means quadrature-path, i.e., a path wherein signal has the same phase as sine signal which is different from the input cosine signal by 90°.

Referring to FIG. 8, an exemplary case when gain of mixer M1 is larger than that of mixer M2 by a predetermined gain mismatch value ($\Delta A1$) is explained. Also, an exemplary case when the first local oscillation in-phase signal (LO1I) precedes the first local oscillation quadrature-phase signal (LO1Q) by 90° plus a predetermined phase mismatch value ($\emptyset_{e1}$) is explained.

In the specification, character I means in-phase signal, i.e., a cosine signal. Character Q means quadrature-phase signal, i.e., a sine signal. As explained in the above, gain mismatch ($\Delta A1$) in the mixers M1 and M2 and phase mismatch ($\emptyset_{e1}$) in the local oscillation signals cannot be completely removed in the conventional IRM having the Weaver architecture.

According to the present invention, in order to compensate gain mismatch occurred in analogue domain, gain of mixers M5 and M6 in digital domain is compensated by a gain compensation value ($\Delta A2$). Further, in order to compensate phase mismatch occurred in analogue domain, phase of mixers M3 and M4 in digital domain is compensated by a phase compensation value ($\emptyset_{e2}$)

Since correct value of gain mismatch ($\Delta A1$) and phase mismatch ($\emptyset_{e1}$) is extremely hard to measure, the present invention provides means for finding gain compensation value ($\Delta A2$) and phase compensation value ($\emptyset_{e2}$) by which the gain mismatch ($\Delta A1$) and phase mismatch ($\emptyset_{e1}$) may be compensated, i.e., influence of the gain mismatch ($\Delta A1$) and phase mismatch ($\emptyset_{e1}$) on the output is minimized.

In accordance with the present invention, methods for determining the gain compensation value ($\Delta A2$) and phase compensation value ($\emptyset_{e2}$) are explained below.

In FIG. 8, output signals of II, IQ, QI, and QQ paths measured at the output nodes may be represented by Eqn. 4.

$$II = (1+\Delta A1)\cos(\Delta \omega t)/4$$

$$IQ = (1+\Delta A1)\sin(\Delta \omega t - \emptyset_{e2})/4$$

$$QI = -(1+\Delta A2)\sin(\Delta \omega t + \emptyset_{e1})/4$$

$$QQ = (1+\Delta A2)\cos(\Delta \omega t + \emptyset_{e1} - \emptyset_{e2})/4 \qquad \text{Eqn. 4}$$

In Eqn. 4, $\Delta A1$ represents gain mismatch between mixers M1 and M2. $\emptyset_{e1}$ represents phase mismatch between the first local oscillation in-phase and quadrature phase signals (LO1I and LO1Q). $\Delta A2$ represents gain compensation value by which gain of mixers (M3 and M4) should become larger than that of mixers (M6 and M5) in order to compensate the gain mismatch ($\Delta A1$). Further, $\emptyset_{e2}$ represents phase compensation value by which phase of local oscillation signal (LO2I) to be driven to mixers (M3 and M5) should be faster than 90° plus that of local oscillation signal (LO2Q) to be driven to mixers (M4 and M6) in order to compensate the phase mismatch ($\emptyset_{e1}$)

Signal output from subtraction means (A1), which subtracts output signal at QQ path from output signal at II path represented by Eqn. 4, may be represented by Eqn. 5.

$$(II-QQ)(t)=1/4[(1+\Delta A1)\cos(\Delta \omega t)-(1+\Delta A2)\cos(\Delta \omega t+\emptyset_{e1}-\emptyset_{e2})]=1/4[(1+\Delta A1)-(1+\Delta A2)\cos(\emptyset_{e1}-\emptyset_{e2})]\cos(\Delta \omega t)+1/4[(1+A1)\sin(\emptyset_{e1}-\emptyset_{e2})\sin(\Delta \omega t) \qquad \text{Eqn. 5}$$

Also, signal output from addition means (A2), which adds output signals at IQ path and QI path represented by Eqn. 4, may be represented by Eqn. 6.

$$(IQ+QI)(t)=1/4[(1+\Delta A1)\sin(\Delta \omega t \emptyset_{e2})+(1+\Delta A2)\sin(\Delta \omega t-\emptyset_{e1})]=1/4(1+\Delta A1)\cos(\emptyset_{e2})-(1+\Delta A2)\cos(\emptyset_{e1})\sin(\Delta \omega t)-1/4[(1+\Delta A1)\sin(\emptyset_{e2})+(1+\Delta A2)\sin(\emptyset_{e1})]\cos(\Delta \omega t) \qquad \text{Eqn. 6}$$

The condition by which (II−QQ)(t) according to Eqn. 5 is minimized may be represented by Eqn. 7.

$$\cos(\emptyset_{e1}-\emptyset_{e2})=(1+\Delta A1)/(1+\Delta A2)\sin(\emptyset_{e1}-\emptyset_{e2})-0 \qquad \text{Eqn. 7}$$

Further, the condition by which (IQ+QI)(t) according to Eqn. 6 is minimized may be represented by Eqn. 8.

$$\cos(\emptyset_{e1}+\emptyset_{e2})=(1\Delta A1)/(1+\Delta A2) \qquad \text{Eqn. 8}$$

As can be seen from Eqns. 7 and 8, the conditions by each of which (II−QQ)(t) and (IQ+QI)(t) is minimized, are different. Therefore, the mismatch compensation values which satisfies one of the conditions cannot always be the same as the mismatch compensation values satisfying the other condition. However, the inventor found out that both (II−QQ)(t) and (IQ+QI)(t) may be simultaneously minimized if the phase compensation value ($\emptyset_{e2}$) at IQ path in the digital domain is changed to (IQ-m) represented by Eqn. 9.

$$IQ_{-m}=(1+\Delta A1)\sin(\Delta \omega t+\emptyset_{e2})/4 \qquad \text{Eqn. 9}$$

By substituting IQ-m of Eqn. 9 for IQ in Eqns. 5 and 6, Eqns. 5 and 6 may be changed to Eqns. 10 and 11.

$$(II-QQ)(t)=1/4[(1+\Delta A1)\cos(\Delta \omega t)-(1+\Delta A2)\cos(\Delta \omega t+\emptyset_{e1}-\emptyset_{e2})]=1/4(1+\Delta A1)-(1+\Delta A2)\cos(\emptyset_{e1}-\emptyset_{e2})]\cos(\Delta \omega t)++1/4[(1+A1)\sin(\emptyset_{e1}-\emptyset_{e2})]\sin(\Delta \omega t) \qquad \text{Eqn. 10}$$

$$(IQ_{-m}+QI)(t)=1/4[(1+\Delta A1)\sin(\Delta \omega t+\emptyset_{e2})-(1+\Delta A2)\sin(\Delta \omega t+\emptyset_{e1})]=1/4[(1+\Delta A1)\cos(\emptyset_{e2})-(1+\Delta A2)\cos(\emptyset_{e1})]\sin(\Delta 107\, t)+1/4[(1+\Delta A1)\sin(\emptyset_{e2})-(1+\Delta A2)\sin(\emptyset_{e1})]\cos(\Delta \omega t) \qquad \text{Eqn. 11}$$

Therefore, conditions by which both (II−QQ)(t) and (IQ+QI)(t) are simultaneously minimized may be represented by Eqns. 12 and 13.

$$\cos(\emptyset_{e1}-\emptyset_{e2})-(1+\Delta A1)=(1+\Delta A2) \qquad \text{Eqn. 12}$$

$$\sin(\emptyset_{e1}-\emptyset_{e2})=0 \qquad \text{Eqn. 13}$$

Since it is extremely hard to measure correct values of gain mismatch ($\Delta A1$) and phase mismatch ($\emptyset_{e1}$), it is extremely hard to find out the gain compensation value ($\Delta A2$) and phase compensation value ($\emptyset_{e2}$) for minimizing the signals represented by Eqns. 12 and 10 by using the conditions of Eqns 12 and 10 only. The present invention attempts to provide a method for finding out the compensation values by varying the gain compensation value ($\Delta A2$) and phase compensation value ($\emptyset_{e2}$) gradually until the gain and phase mismatch occurred in the analogue domain is compensated. The condition may be represented by Eqn. 14.

$$(II-QQ)^2+(IQ_m+QI)^2=[(\Delta A1-\Delta A2)\cos(\Delta \omega t)+(\emptyset_{e1}-\emptyset_{e2})\sin(\Delta \omega t)]^2/16+[(\Delta A1-\Delta A2)\sin(\Delta \omega t)-(\emptyset_{e1}-\emptyset_{e2})\cos(\Delta \omega t)]^2/16=[(\Delta A1-\Delta A2)^2+(\emptyset_{e1}-\emptyset_{e2})^2/16 \qquad \text{Eqn. 14}$$

As one can easily acknowledge from Eqn. 14, it is possible to determine the optimal condition, by which gain mismatch and phase mismatch occurred in the analogue domain can be compensated, by gradually varying gain compensation value ($\Delta A2$) and phase compensation value ($\emptyset_{e2}$).

Figure 9:
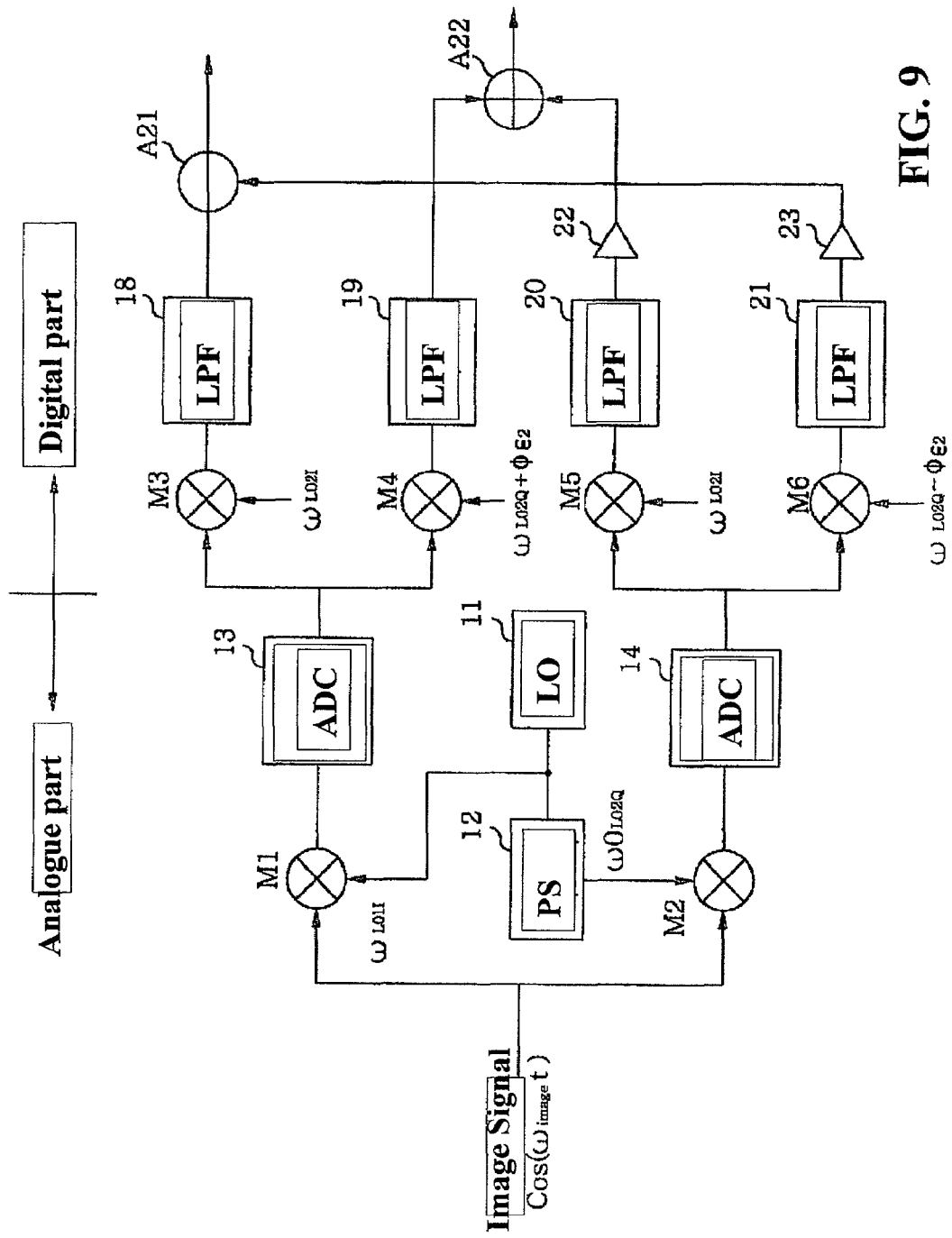
FIG. 9 shows a block diagram for illustrating a mixer circuit with image frequency signal cancellation according to the present invention.
Figure 10:
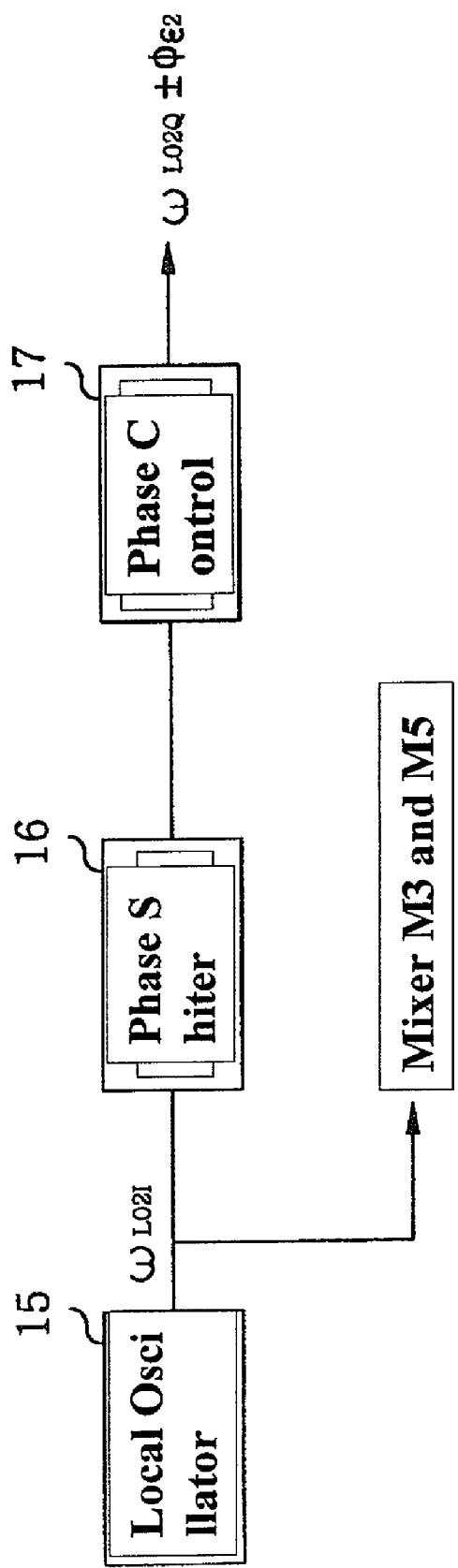
FIG. 10 shows a block diagram for illustrating phase compensation operation of the present invention.

FIG. 9 shows a block diagram for illustrating a mixer circuit with image frequency signal cancellation according to the present invention. FIG. 10 shows a block diagram for illustrating phase compensation operation of the present invention.

As shown in FIG. 9, an input signal, $\cos(\omega_{image}t)$, having image frequency of, e.g., 2,400 MHz, is shifted to the first intermediate frequency of 1.875 MHz by being mixed with the first local oscillation in-phase and quadrature-phase signals (LO1I and LO1Q), having the first local oscillation frequency of, e.g., 2398.125 MHz, at mixers M1 and M2. Preferably, mixers M1 and M2 are made of passive mixers. Local oscillator (11) for providing the first local oscillation signal (LO1) may be implemented by the branch line coupler. Phase shifter (12) shifts phase of the first local oscillation signal (LO1I) provided by the local oscillator (11) by 90°.

The signal output from mixers M1 and M2, which has the first intermediate frequency, e.g., 1.875 MHz, is converted to a digital signal of 12 bits width while it passes through ADCs (13 and 14). Mixers M3 through M6 in the digital domain shift the signal of the first intermediate frequency to a signal having frequency of 0.1875 MHz by using the second local oscillation in-phase and quadrature-phase signals (LO2I and LO2Q). Here, the second local oscillation in-phase signal is provided by the local oscillator (15) of FIG. 10. Phase shifter (16) shifts phase of the second local oscillation signal (LO2I) provided by the local oscillator (15) by −90°, to provide the second local oscillation quadrature-phase signal (LO2Q). As shown in FIG. 10, the phase shifter (16) is connected to a phase controller (17). The phase controller (17) generates phase compensation value ($\emptyset_{\epsilon2}$).

The second intermediate frequency signals output from mixers M3 through M6 are provided to low pass filters (18 through 21). The low pass filters (18 though 21) suppress the upper frequency components, which are generated in the process of phase-shift at mixers M3 through M6, in the second intermediate frequency signals. Although it is not explained in detail in connection with the ADCs (13 and 14), one can easily acknowledge that low pass filters may also be provided in the ADCs (13 and 14).

Variable amplifiers (22 and 23) are connected to the low pass filters (20 and 21). The variable amplifiers (22 and 23) vary gain of mixers M5 and M6 to compensate gain mismatch occurred in the analogue domain by using gain compensation value ($\Delta A2$).

According to an embodiment of the present invention, means for gradually adjusting the phase controller (17) and variable amplifier (22 and 23) may be implemented by using digital circuitry. According to other embodiment of the invention, a user may adjust phase controller (17) and variable amplifier (22 and 23) to minimize the influence of image frequency signals.

Figure 11:
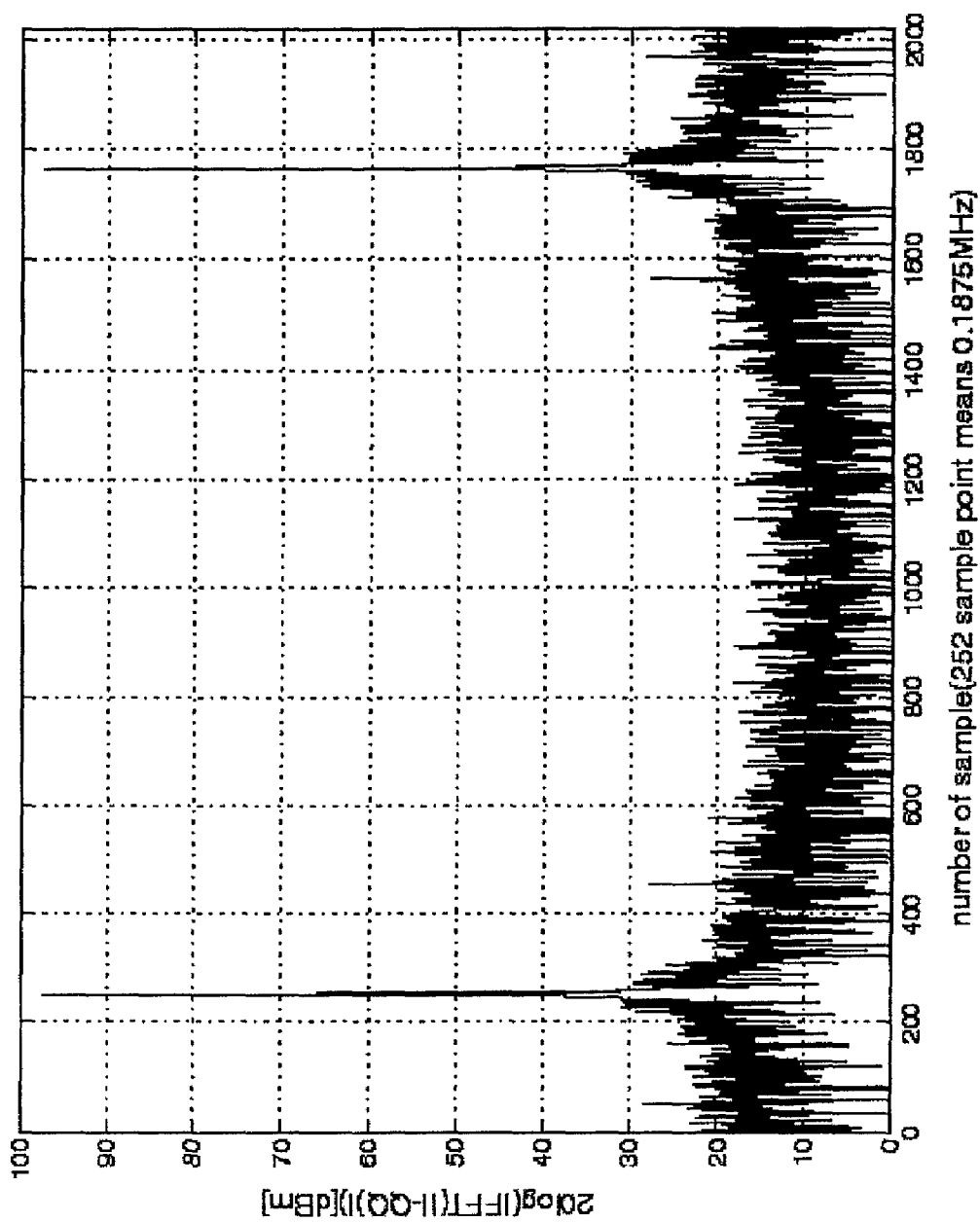
FIG. 11 shows a graph for illustrating spectrum of II–QQ path signal when data of, e.g., 2401.875 MHz is input to the embodiment of the present invention.
Figure 12:
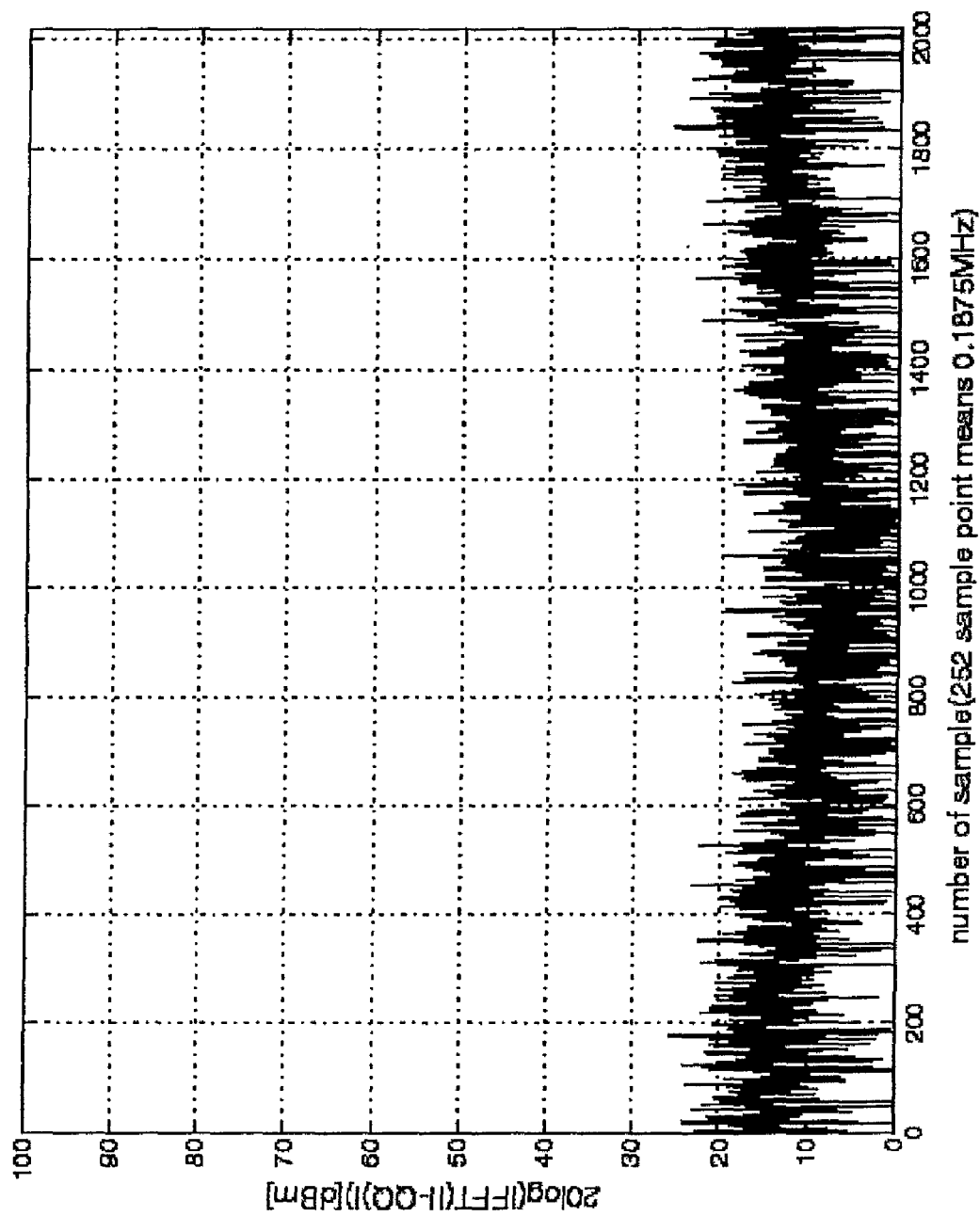
FIG. 12 shows a graph for illustrating spectrum of II–QQ path signal when image frequency signals are input to the embodiment of the present invention.

For experimental purpose, the inventor generated an analogue signal of 1.875 MHz and, then, converted the signal by using a ADC with the sampling rate of 8 times of the Nyquist rate. Then, level of the converted signal is measured at 24000 points, i.e., 3000 periods. The present invention was simulated by using a program, Matlab, with the measured data. FIG. 11 shows a graph for illustrating spectrum of II–QQ path signal when data of, e.g., 2401.875 MHz is input to the embodiment of the present invention. FIG. 12 shows a graph for illustrating spectrum of II–QQ path signal when image frequency signals are input to the embodiment of the present invention. As shown in FIGS. 11 and 12, more than 80 dB of image frequency components was cancelled. In this case, phase compensation value ($\emptyset_{\epsilon2}$) was 5.26° and gain compensation value was ($\Delta A2$) 11.82%.

As described above, it was possible to effectively reject image frequency components in a mixer of the Weaver architecture.

We claim:

1. An image rejection mixer comprising:

first and second mixers, each of which mixes an input signal with each of first local oscillation in-phase signal and first local oscillation quadrature-phase signal, respectively, wherein the first local oscillation quadrature-phase signal is resulted by shifting the first local oscillation in-phase signal by −90°;

first and second analogue to digital converting means, each of which transforms each output of said first and second mixers to digital signal;

third mixer mixes output of said first analogue to digital converting means with second local oscillation in-phase signal;

fourth mixer mixes output of said first analogue to digital converting means with second local oscillation quadrature-phase signal;

wherein the second local oscillation quadrature-phase signal is resulted by shifting the second local oscillation in-phase signal by −90°;

fifth mixer mixes output of said output of said second analogue to digital converting means with second local oscillation in-phase signal;

sixth mixer mixes output of said second analogue to digital converting means with second local oscillation quadrature-phase signal;

means for subtracting output of said sixth mixer from output of said third mixer;

means for adding outputs of said fourth and fifth mixers; and means for compensating gain mismatch between said first and second mixers by controlling output of said means for subtracting and said means for adding.

2. The image rejection mixer of claim 1, wherein said means for compensating adjusts gain of said fifth and sixth mixers to be different from gain of said third and fourth mixers by a predetermined gain compensation value, and gradually varying the gain compensation value until influence of the gain mismatch between said first and second mixers on the output is minimized.

3. The image rejection mixer of claim 2, wherein said means for compensating comprising means for varying gain of said third and fourth mixers.

4. An image rejection mixer comprising:

first and second mixers, each of which mixes an input signal with each of first local oscillation in-phase signal and first local oscillation quadrature-phase signal, respectively, wherein the first local oscillation quadrature-phase signal is resulted by shifting the first local oscillation in-phase signal by −90°;

first and second analogue to digital converting means, each of which transforms each output of said first and second mixers to digital signal;

third mixer mixes output of said first analogue to digital converting means with second local oscillation in-phase signal;

fourth mixer mixes output of said first analogue to digital converting means with second local oscillation quadrature-phase signal;

wherein the second local oscillation quadrature-phase signal is resulted by shifting the second local oscillation in-phase signal by −90°;

fifth mixer mixes output of said output of said second analogue to digital converting means with second local oscillation in-phase signal;

sixth mixer mixes output of said second analogue to digital converting means with second local oscillation quadrature-phase signal;

means for subtracting output of said sixth mixer from output of said third mixer;

means for adding outputs of said fourth and fifth mixers; and means for reducing difference between 90° and phase difference between the first local oscillation in-phase and quadrature-phase signals by controlling the output of said means for subtracting and said means for adding.

5. The image rejection mixer of claim 4, wherein said means for compensating adjusts phase difference between the second local oscillation in-phase and quadrature-phase signals to be larger or smaller than 90° by a predetermined phase compensation value, and gradually varying the phase compensation value until influence of the phase mismatch of the first local oscillation in-phase and quadrature-phase signals on the output is minimized.

6. The image rejection mixer of claim 5, wherein said means for compensating comprising:

an oscillator for providing the second local oscillation in-phase signal;

a phase shifter for shifting phase of the second local oscillation signal by −90°;

a phase controller for varying phase of output of said phase shifter;

means for providing output of said oscillator to said third and fifth mixers and providing output of said phase controller to said fourth and sixth mixers.

7. An image rejection mixer comprising:

first and second mixers, each of which mixes an input signal with each of first local oscillation in-phase signal and first local oscillation quadrature-phase signal, respectively, wherein the first local oscillation quadrature-phase signal is resulted by shifting the first local oscillation in-phase signal by −90°;

first and second analogue to digital converting means, each of which transforms each output of said first and second mixers to digital signal;

third mixer mixes output of said first analogue to digital converting means with second local oscillation in-phase signal;

fourth mixer mixes output of said first analogue to digital converting means with second local oscillation quadrature-phase signal;

wherein the second local oscillation quadrature-phase signal is resulted by shifting the second local oscillation in-phase signal by −90°;

fifth mixer mixes output of said output of said second analogue to digital converting means with second local oscillation in-phase signal;

sixth mixer mixes output of said second analogue to digital converting means with second local oscillation quadrature-phase signal;

means for subtracting output of said sixth mixer from output of said third mixer;

means for adding outputs of said fourth and fifth mixers;

means for compensating gain mismatch between said first and second mixers by controlling output of said means for subtracting and said means for adding; and means for reducing difference between 90° and phase difference between the first local oscillation in-phase and quadrature-phase signals by controlling the output of said means for subtracting and said means for adding.

* * * * *